United States Patent
Harting et al.

(10) Patent No.: US 8,026,565 B2
(45) Date of Patent: Sep. 27, 2011

(54) THIN FILM SEMICONDUCTOR DEVICE COMPRISING NANOCRYSTALLINE SILICON POWDER

(75) Inventors: Margit Harting, Mowbray (ZA); David Thomas Britton, Cape Town (ZA)

(73) Assignee: University of Cape Town, Cape Town (ZA)

( * ) Notice: Subject to any disclaimer, the term of this patent is extended or adjusted under 35 U.S.C. 154(b) by 175 days.

(21) Appl. No.: 10/543,475

(22) PCT Filed: Jan. 30, 2004

(86) PCT No.: PCT/IB2004/000221
§ 371 (c)(1),
(2), (4) Date: Mar. 8, 2006

(87) PCT Pub. No.: WO2004/068536
PCT Pub. Date: Aug. 12, 2004

(65) Prior Publication Data
US 2006/0199313 A1    Sep. 7, 2006

(30) Foreign Application Priority Data
Jan. 30, 2003   (ZA) .................................. 2003/0849

(51) Int. Cl.
*B82B 00/00*   (2006.01)
*B82Y 20/00*   (2011.01)

(52) U.S. Cl. ......... 257/462; 257/E25.009; 257/E29.056; 257/E31.041; 257/E31.073; 257/E27.125; 438/149; 438/161; 438/216; 977/775; 977/778; 977/785

(58) Field of Classification Search ........... 257/E25.009, 257/E27.124–E27.126, E25.007, 462, E31.052–E31.073, E31.041, E29.056, E29.117, E27.125; 136/252; 977/773–775, 778–779, 783, 785, 977/787–788; 438/149, 161, 164, 216, 280
See application file for complete search history.

(56) References Cited

U.S. PATENT DOCUMENTS

| | | | |
|---|---|---|---|
| 3,283,222 A | 11/1966 | Henry | 317/235 |
| 3,468,018 A | 9/1969 | Lutz | 29/577 |
| 5,637,537 A * | 6/1997 | Nath et al. | 438/460 |
| 5,917,279 A * | 6/1999 | Elschner et al. | 313/506 |
| 6,074,791 A * | 6/2000 | Jennings et al. | 430/58.8 |
| 6,080,606 A * | 6/2000 | Gleskova et al. | 438/151 |

(Continued)

FOREIGN PATENT DOCUMENTS

JP       2002-278599      *  9/2002

(Continued)

*Primary Examiner* — Matthew Landau
*Assistant Examiner* — Maliheh Malek
(74) *Attorney, Agent, or Firm* — Frommer Lawrence & Haug LLP; Ronald R Santucci

(57) ABSTRACT

A thin film semiconductor in the form of a metal semiconductor field effect transistor, includes a substrate 10 of paper sheet material and a number of thin film active inorganic layers that are deposited in layers on the substrate. The active layers are printed using an offset lithography printing process. A first active layer comprises source 12.1 and drain 12.2 conductors of colloidal silver ink, that are printed directly onto the paper substrate. A second active layer is an intrinsic semiconductor layer 14 of colloidal nanocrystalline silicon ink which is printed onto the first layer. A third active layer comprises a metallic conductor 16 of colloidal silver which is printed onto the second layer to form a gate electrode. This invention extends to other thin film semiconductors such as photovoltaic cells and to a method of manufacturing semiconductors.

23 Claims, 6 Drawing Sheets

U.S. PATENT DOCUMENTS

| | | | |
|---|---|---|---|
| 6,459,035 B2* | 10/2002 | Ziegler et al. | 136/257 |
| 6,479,834 B1* | 11/2002 | Suzuki | 250/584 |
| 6,586,785 B2* | 7/2003 | Flagan et al. | 257/261 |
| 6,919,119 B2* | 7/2005 | Kalkan et al. | 428/119 |
| 7,061,009 B2* | 6/2006 | Nelles et al. | 257/40 |
| 7,550,802 B2* | 6/2009 | Koyanagi et al. | 257/324 |
| 7,763,530 B2* | 7/2010 | Britton et al. | 438/514 |
| 2002/0018100 A1* | 2/2002 | Katoh | 347/55 |
| 2002/0018860 A1* | 2/2002 | Filippou et al. | 427/532 |
| 2002/0187312 A1* | 12/2002 | Fonash et al. | 428/195 |
| 2003/0067000 A1* | 4/2003 | Nelles et al. | 257/40 |
| 2003/0129385 A1* | 7/2003 | Hojo et al. | 428/323 |
| 2003/0148024 A1* | 8/2003 | Kodas et al. | 427/125 |
| 2003/0157783 A1* | 8/2003 | Fonash et al. | 438/458 |
| 2003/0192584 A1* | 10/2003 | Beckenbaugh et al. | 136/256 |
| 2003/0215865 A1* | 11/2003 | Mayer et al. | 435/6 |
| 2003/0226498 A1* | 12/2003 | Alivisatos et al. | 117/84 |
| 2004/0082098 A1 | 4/2004 | Schmid | 438/99 |
| 2004/0126582 A1* | 7/2004 | Ng et al. | 428/403 |
| 2005/0104060 A1* | 5/2005 | Halik et al. | 257/40 |
| 2006/0006378 A1* | 1/2006 | Hirai | 257/40 |
| 2007/0196571 A1* | 8/2007 | Ozin et al. | 427/199 |
| 2009/0001936 A1* | 1/2009 | Green | 320/137 |

FOREIGN PATENT DOCUMENTS

WO     WO 00/50890     8/2000

* cited by examiner

| VGS | = | Gate Source Voltage |
| VDS | = | Drain Source Voltage |
| IDS | = | Drain Source Current |

| VGS | = | Gate Source Voltage |
|---|---|---|
| VDS | = | Drain Source Voltage |
| IDS | = | Drain Source Current |

THIN FILM SEMICONDUCTOR DEVICE COMPRISING NANOCRYSTALLINE SILICON POWDER

This application is a 371 of PCT/IB2004/000221 filed on Jan. 30, 2004, published on Aug. 12, 2004 under publication number WO 2004/068536 A2 and claims priority benefits of South African Patent Application No. ZA 2003/0849 filed Jan. 30, 2003.

FIELD OF INVENTION

THIS INVENTION relates to a thin film semiconductor device.

It also relates to a method of manufacturing a thin film semiconductor device.

BACKGROUND OF INVENTION

Semiconductor devices currently in production or under commercial development, can be classified in three categories: single crystalline silicon, bulk polycrystalline silicon or thin film semiconductor. The first two are expensive to produce and are aimed at the high end of the market. Most research and development is aimed at improving the efficiency and long-term stability of such devices with little regard to cost.

On the other hand, thin film semiconductors are generally intended for lower cost applications, where absolute efficiency and compactness is not a prerequisite. Long-term stability is still a desirable goal for existing thin film semiconductors because of the relatively high production costs and the high material costs of the substrate.

Most commercial thin films semiconductor devices are based on hydrogenated amorphous silicon (a-Si:H) which may also contain nanocrystalline or microcrystalline phases deposited by various chemical vapour deposition (CVD) processes. The two main techniques are plasma enhanced CVD (PECVD) also know as glow discharge CVD and catalytic CVD (cat-CVD) also known as hot wire CVD (HWCVD). In the case of photovoltaic semiconductor devices, all CVD deposited thin film semiconductors and a-Si:H, in particular, suffer from light induced degradation (referred to as "the Staebler-Wronksi effect") which is most significant over the first few years of operation. Consequently, all commercial photovoltaic semiconductor devices are over-engineered so that they degrade according to the specification and are consequently fitted with regulators to keep the output voltage constant. In commercial semiconduction based solar cells, the substrate is typically glass which limits the size of the semiconductor device due to its mechanical stability and weight. Glass also has the added disadvantage of being rigid and brittle.

All commercial thin film transistors (TFT) are based on CVD deposited semiconductor films and involve extensive use of photolithography, masks and chemical etching. In high density transistor arrays, a vertical stacking sequence of different semiconductor layers is used. The deposition techniques for depositing the various semiconductor layers, including for the gate electrodes, are the same as for semiconduction based solar cells and the usual substrate is glass.

A major factor limiting the production of inexpensive semiconductor devices, is the use of vacuum deposition processes in the production. Such vacuum deposition processes are relatively expensive and as such, add significantly to the cost of producing semiconductor devices. Further, semiconductor layers deposited using CVD processes are relatively rigid and as such, do not combine well with flexible substrates.

SUMMARY OF INVENTION

According to a first aspect of the invention there is provided a thin film semiconductor device including
a substrate; and
thin film active layers of inorganic material that are deposited in layers on the substrate, wherein at least one active layer is printed onto the substrate or an underlying active layer.

Any reference herein to an "active layer" must be interpreted to include a reference to a semiconductor layer, an insulator layer and metallic contacts.

The active layer may be printed using a transfer printing process selected from a group consisting of offset lithography printing, block printing, letterpress printing and screenprinting using colloidal inks.

The substrate may be of a material including cellulose. More particularly, the substrate may be of paper sheet material.

The semiconductor device may include an active layer comprising a colloidal ink which includes an inorganic semiconductor material powder suspended in a solvent/binder carrier composition.

Each of the active layers may be printed onto one of an underlying active layer and the substrate.

The semiconductor device may be in the form of a photovoltaic cell.

The semiconductor device may be in the form of a field effect transistor.

According to a second aspect of the invention there is provided a method of manufacturing a thin film semiconductor device, including depositing a number of thin film active layers of inorganic material, wherein at least one active layer is printed onto one of the substrate and an underlying active layer.

Said one active layer may be printed using a transfer printing process selected from a group consisting of offset lithography printing, block printing, letterpress printing and screen printing using colloidal inks.

The method may include printing each active layer onto one of the substrate and an underlying active layer.

The method may include printing an active layer in the form of a colloidal ink which includes an inorganic semiconductor material powder suspended in a solvent/binder carrier composition, onto one of a substrate and an underlying active layer.

Any reference herein to "printing" an active layer onto a surface, must be interpreted sufficiently broadly to include coating methods such as spraying, brushing or spin coating an active layer onto a surface, i.e. methods in which no chemical or physical phase change of the coating material occurs during deposition.

Further features of the invention are described hereinafter by way of a non-limiting example of the invention, with reference to and as illustrated in the accompanying diagrammatic drawings. In the drawings.

EXAMPLE 1

Figure 1:
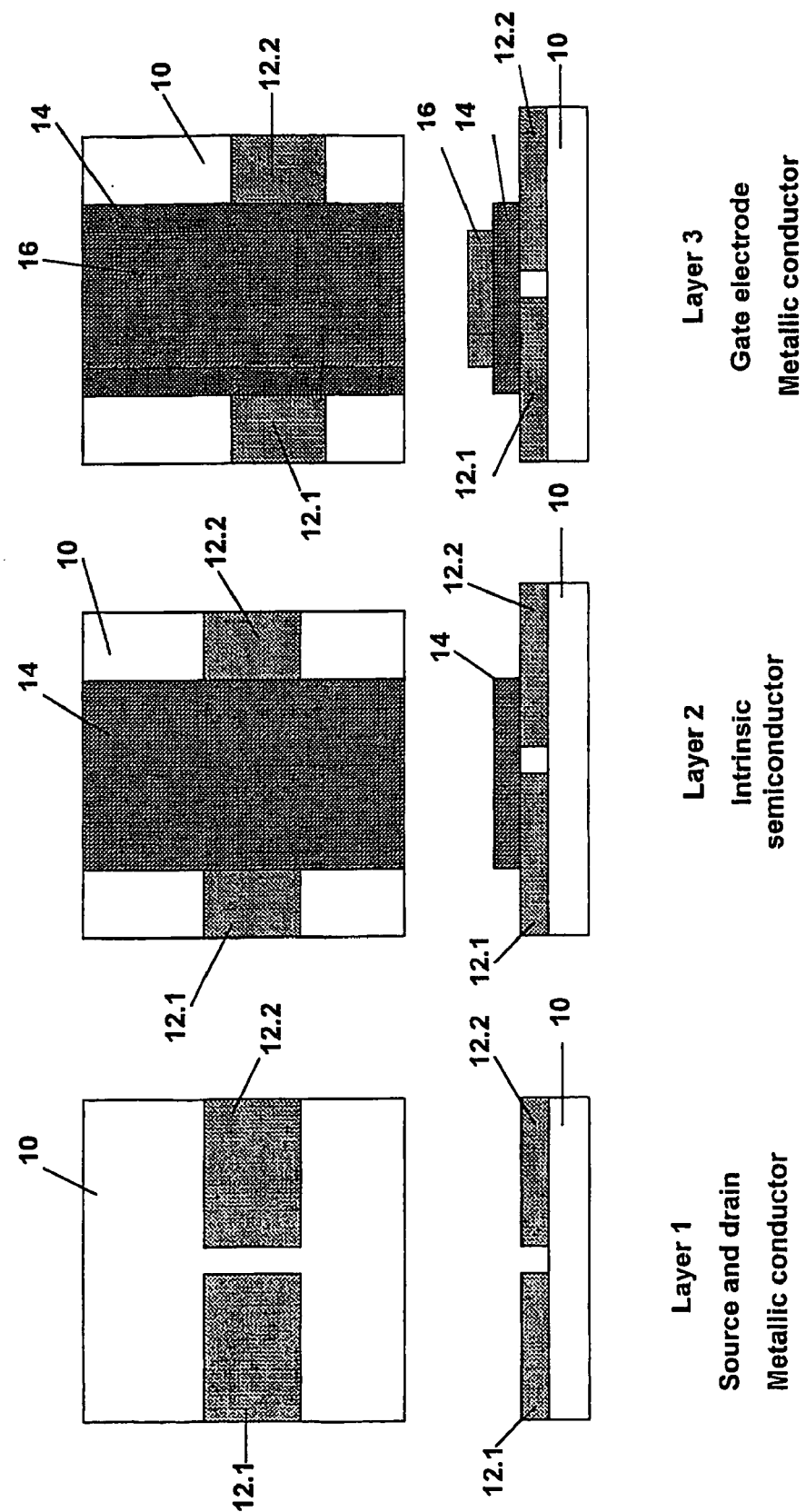
FIG. 1 shows cross-sections and top plan views showing the configuration of the various layers of a top gate metal semiconductor field effect transistor (MS-FET) according to a first example of the invention.

FIG. 1 shows a top gate MS-FET comprising three thin film semiconductor layers which are supported on a substrate 10 of paper sheet. The Applicant has found plain office paper such as Mondi Rotatrim wood free office paper, having a density of 80 g/m$^2$, to be suitable for the purpose. The first active layer comprises two spaced metallic conductors of, for example, colloidal silver such as Dupont Luxprint 5000, which comprises the source 12.1 and drain 12.2 of the field effect transistor. The metallic conductors forming the source and drain are printed directly onto the paper substrate 10 using an offset lithograph printing process. The source and drain contacts have layer thicknesses of 300-400 microns.

The second semiconductor layer is an intrinsic semiconductor layer 14 of colloidal nanocrystalline silicon (nc-Si) ink which is printed onto the first layer using an offset lithography printing process. The colloidal nc-Si material forming the semiconductor layer 14 is produced using 30 mm diameter intrinsic silicon powder in a solvent-binder carrier. The applicant has found that other semiconductor nanopowders, for example, silicon carbide, cadmium sulphide, can be used for other applications. For example, doped semiconductor layers can be produced by replacing the intrinsic nanosilicon powder with doped nanosilicon material. The relative concentrations of the component substances in the nc-Si ink which is used to form the semiconductor layer 14, are determined by the viscosity of the ink required in the printing process. In this example, the solvent-binder carrier is a mixture of a polystyrene binder and chloroform as solvent. Other polymer binders which can be used include biopolymers such as cellulose acetate butyrate (CAB) in a variety of solvents such as ether and commercial lacquer thinners. The semiconductor layer 14 has a thicknesses of the order of 1-2 microns when a polystyrene binder and an offset lithography printing process is used.

The third active layer is in the form of a metallic conductor 16 of, for example, colloidal silver material such as Dupont Luxprint 5000, which is printed onto the second layer to form a gate electrode using an offset lithography printing process. Typically, the third layer has a thickness of between 300 and 400 microns.

The top gate MS-FET has a "cross" geometry wherein the top and bottom contacts extend at right angles to one another and can thus be connected directly into the interconnects. As such, this allows the interconnects to also be printed, either at the same time or subsequently if different layers are connected, making the production process simpler and cheaper.

The Applicant envisages that offset lithography printing will be used for printing the various semiconductor layers in the commercial production of semiconductor devices. However, the Applicant believes that various other printing techniques such as blockprinting, screenprinting, letterpress printing, relief printing, stamp printing, gravure printing and "printing" by spraying, brushing or spin coating a colloidal ink onto a substrate/active layer can also be used. The Applicant envisages further that an array of semiconductor devices similar to the MS-FET described in Example 1, can be produced in a standard threecolour printing run. More elaborate heterostructures, including doped semiconductor layers can be produced by extending the number of "colours" in the printing process.

Figure 5:
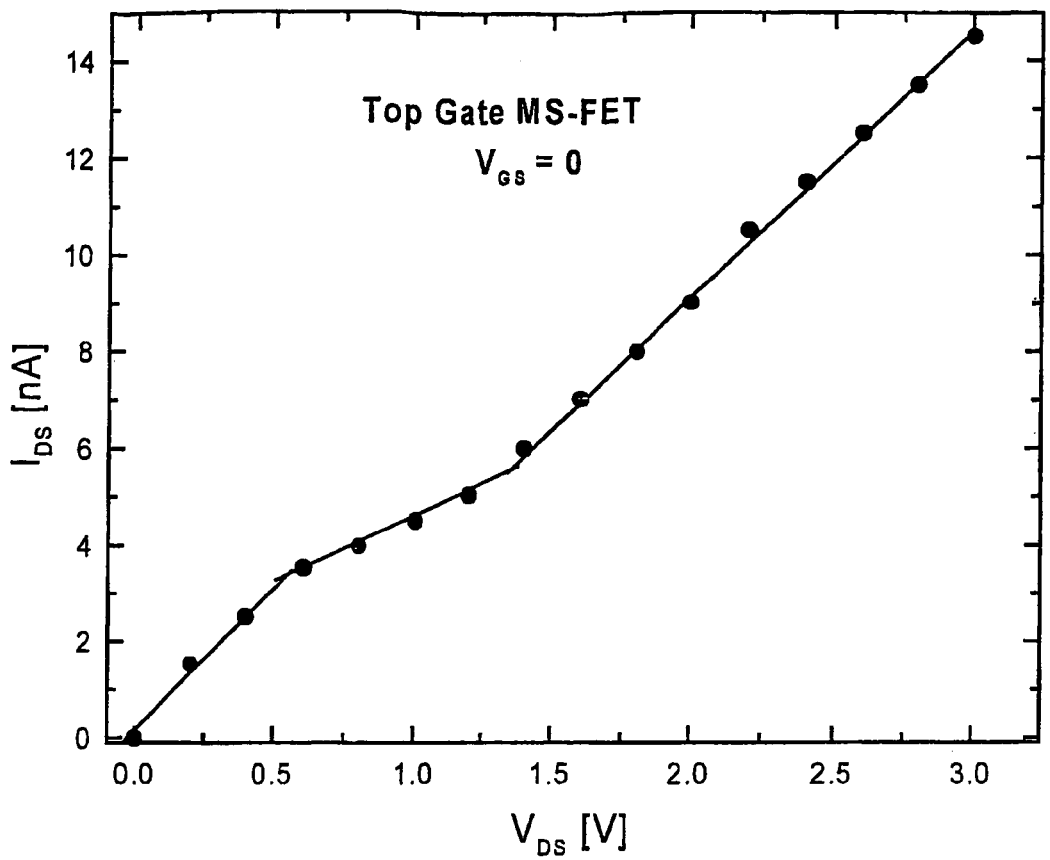
FIG. 5 shows the current voltage characteristics of a MS-FET according to a first example of the invention.

With reference to FIG. 5 of the drawings, the current-voltage characteristics of a prototype top gate MS-FET manufactured by the Applicant in accordance with the invention, are illustrated. The prototype MS-FET tested was equivalent to the top gate MS-FET described in Example 1, with the only difference being that the various active layers were block printed instead of being printed in an offset lithography printing process.

EXAMPLE 2

Figure 2:
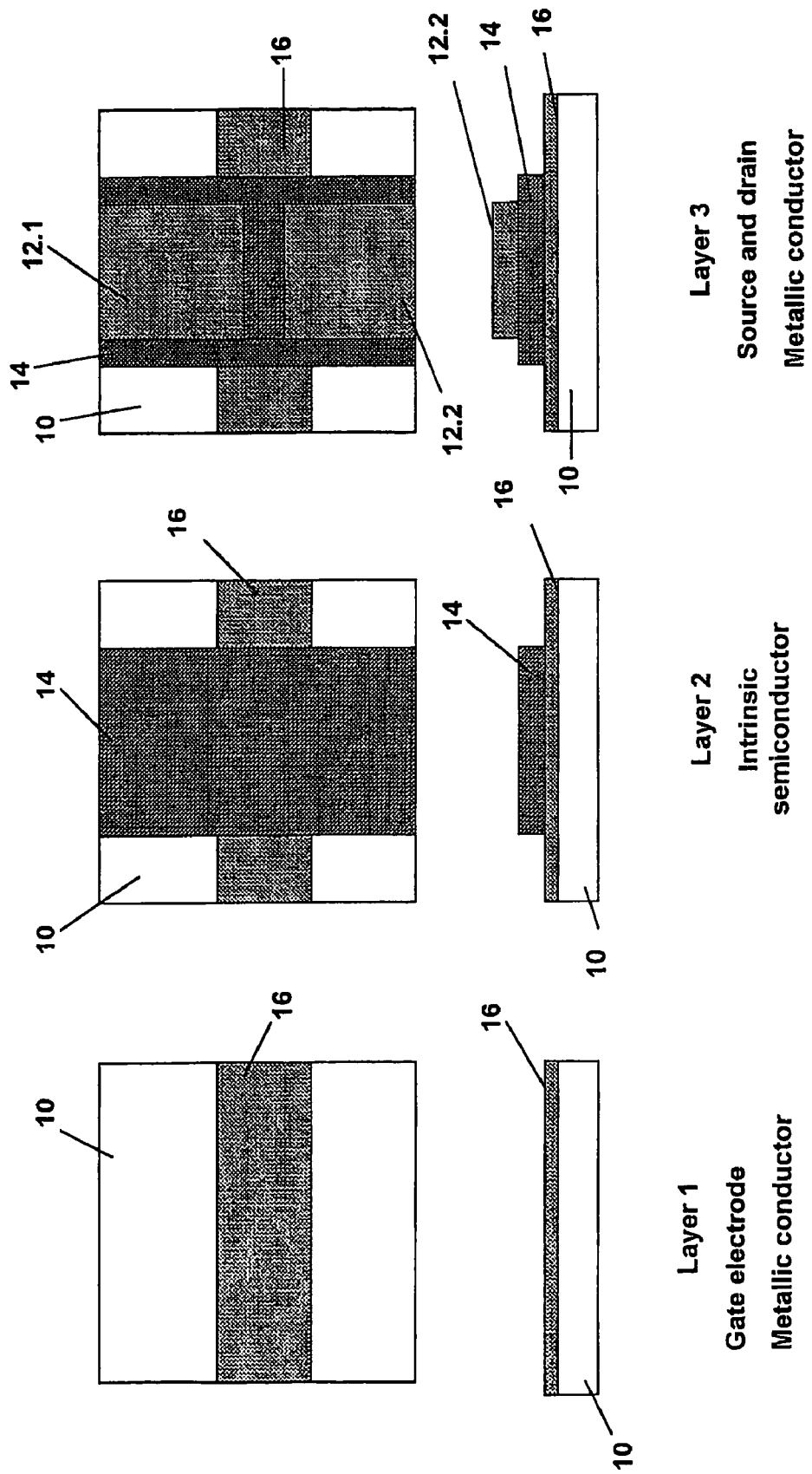
FIG. 2 shows cross-sections and top plan views showing the configuration of the various layers of a bottom gate MS-FET according to a second example of the invention.

FIG. 2 shows a bottom gate MS-FET comprising three thin film semiconductor layers which are supported on a substrate 10 of paper sheet. The bottom gate MS-FET is the same as the top gate MS-FET illustrated in FIG. 1, with the only difference being that the semiconductor layers have been reversed to form a bottom gate field effect transistor. This allows direct connection of other active components to the source and drain of the transistor for faster switching. The same reference numerals are used in FIG. 2 to designate features of the bottom gate MS-FET that are the same as those of the top gate MS-FET shown in FIG. 1. In this example, the same printing process and material used in the top gate MS-FET of Example 1, is used for the various semiconductor layers.

Figure 6:
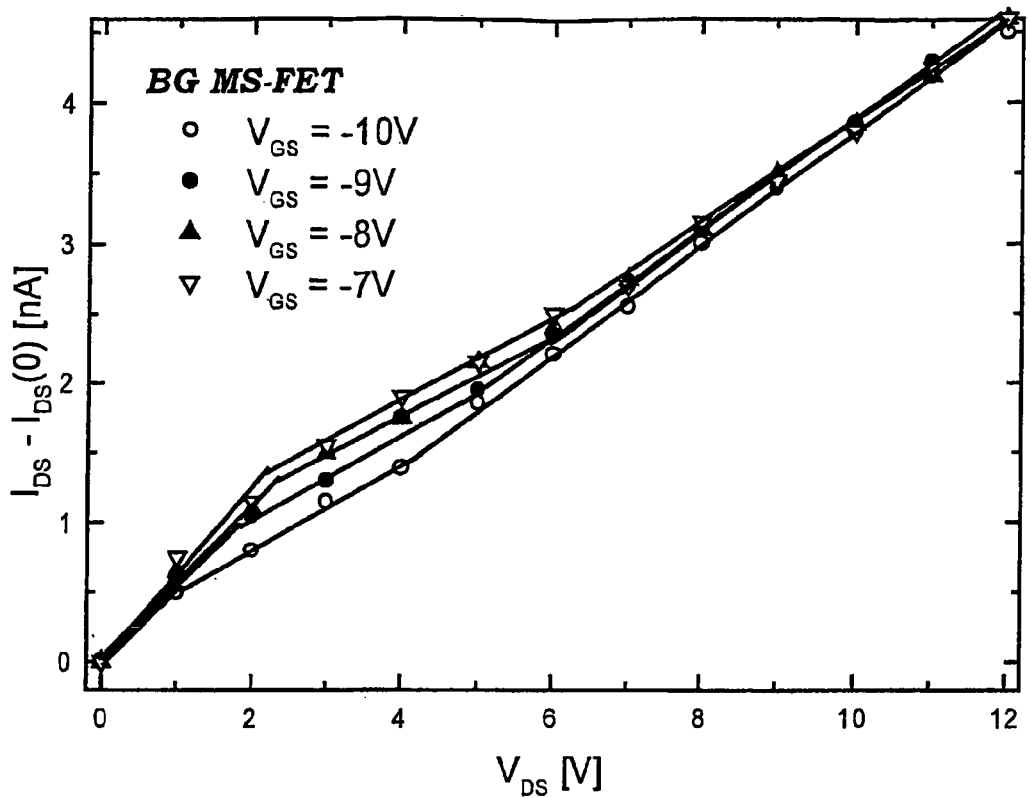
FIG. 6 shows the current voltage characteristics of a MS-FET according to a second example of the invention.

With reference to FIG. 6 of the drawings, the current-voltage characteristics of a prototype bottom gate MS-FET manufactured by the Applicant in accordance with the invention, are illustrated. The prototype MS-FET tested was equivalent to the bottom gate MS-FET described in Example 2, with the only difference being that the various active layers were block printed instead of being printed in an offset lithography printing process.

EXAMPLE 3

Figure 3:
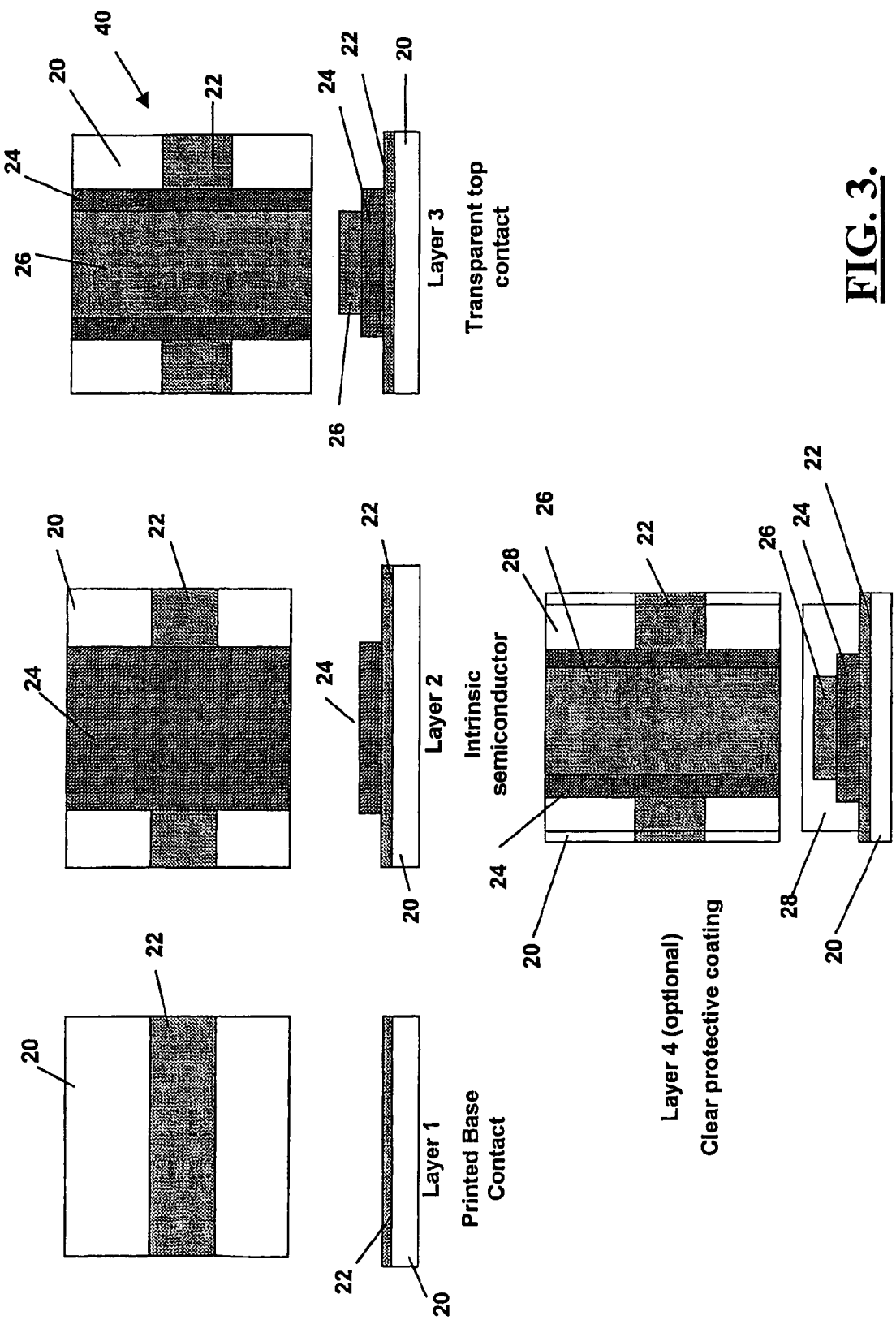
FIG. 3 shows a cross-section and top plan view showing the configuration of the various layers of a photovoltaic cell in accordance with a third example of the invention.
Figure 4:
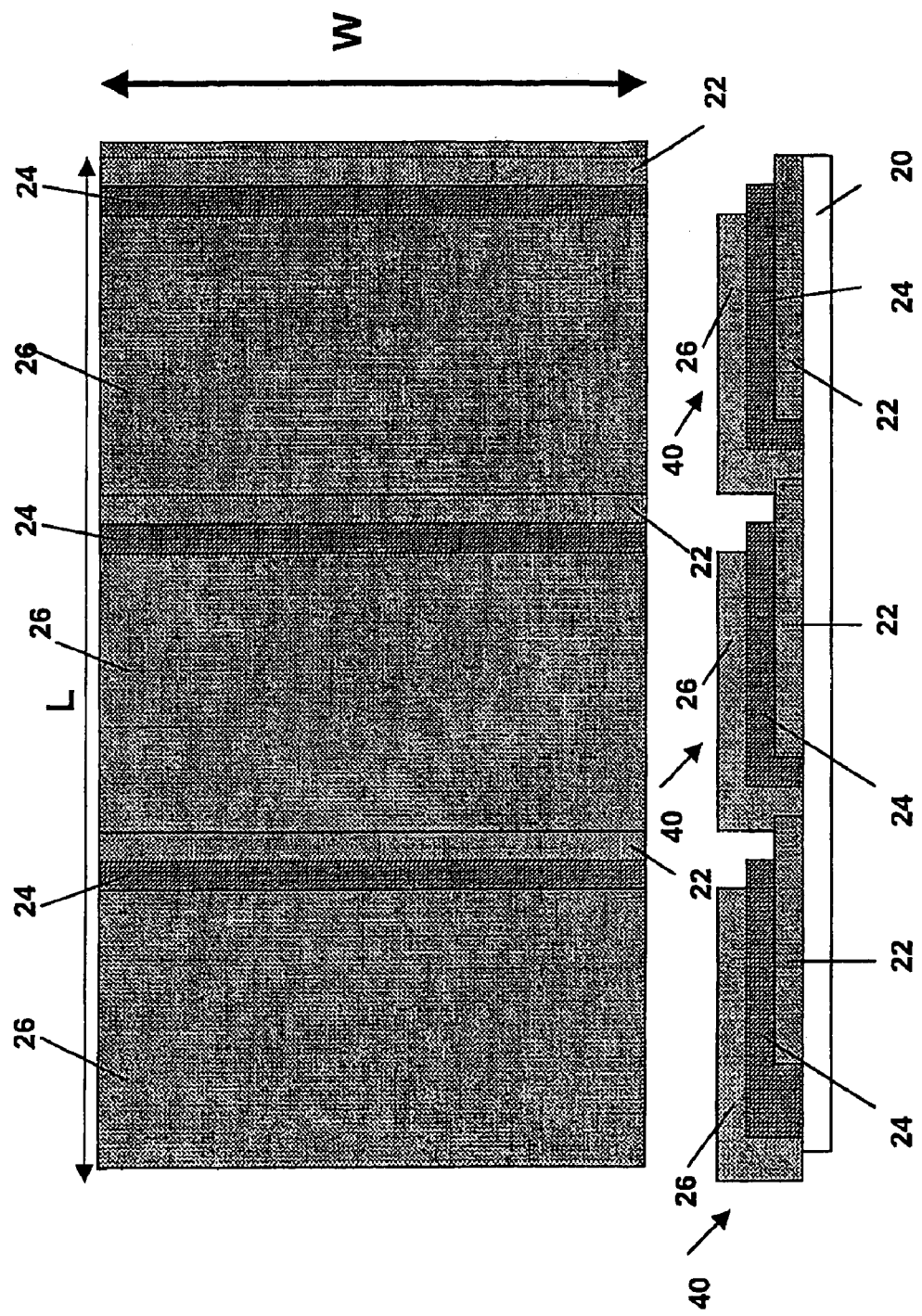
FIG. 4 shows a top plan view and cross-section showing the configuration of a photovoltaic battery in accordance with a fourth example of the invention.

With reference to FIG. 3 of the drawings, a thin film semiconductor in the form of a photovoltaic cell 40 is shown which comprises an intrinsic semiconductor 24 (layer 2) sandwiched between two electrodes. More particularly, the photovoltaic cell comprises a first active layer in the form of a metallic base contact 22 of, for example, colloidal silver that is printed onto a major surface of a paper substrate 20 of plain white office paper such as Mondi Rotatrim wood free paper. The second active layer in the form an intrinsic semiconductor, is applied to the first layer. The second layer comprises, for example, colloidal nc-Si which is printed onto the first layer. A third active layer which forms a top contact is a transparent p-type conductor 26, for example, of colloidal indium tin oxide (ITO) such as Dupont Luxprint 7162E translucent conductor material, which is printed onto the second layer. The fourth layer which is optional, is in the form of a clear protective coating 28 of dielectric material such as a clear lacquer, which is printed onto the third layer.

The first and second layers are produced in the same manner as is described in Example 1 for the top gate MS-FET. The third layer is applied using an offset lithography printing process, however, the Applicant has successfully applied the third layer using block printing and brushing techniques in prototype semiconductor structures.

EXAMPLE 4

This example shows a construction of a photovoltaic battery which comprises three layers which are deposited onto a paper substrate 20. The battery comprises three photovoltaic cells 40 which are connected in series. The first layer is in the form of a printed metallic base contact 50, for example, of colloidal silver which is printed onto the paper substrate 10. The second layer comprises a single intrinsic semiconductor layer or a semiconductor structure in n-i-p sequence comprising, for example, a colloidal nc-Si layer that is printed onto the first layer. The photovoltaic battery includes a third layer comprising a transparent top contact 54 of, for example, colloidal ITO, that is printed onto the second layer. It will be appreciated that individual battery cells are laid down as strips across the paper substrate 10 by overlapping the top and bottom contacts of neighbouring strips, the cells are automatically connected together in series.

Only two external connections are then required: one at the base contact and one at the top contact. The various semiconductor layers are applied in a three or four colour offset lithography or letterpress printing process.

The open circuit voltage is the product of the number of strips times the cell emf. The width W of the strip determines the area of each cell and therefore for constant current density, the current produced. As such, the length L of the strip determines the number of cells in series and therefore the voltage across the battery.

The Applicant has found that paper fulfils all the necessary requirements for a cheap, robust and flexible substrate. With paper being hygroscopic, the Applicant envisages that it will be necessary to provide a water-resistant seal to protect the paper substrate against degradation due to the ingress of water. It is envisaged by the Applicant that this can be achieved with a varnish which would have to be transparent in the case of use in a solar cell or by keeping the device in a glass cabinet.

The Applicant envisages that a low cost solar cell device which can be replaced after several years of use, can be produced in accordance with the invention. Such low cost solar cell devices can also be used for disposable products such as trickle chargers and power supplies for cell phones and portable computers which make use of ambient light. The Applicant envisages that in such low cost solar cell devices, electrical connections can be made directly to the paper substrate either by crocodile clips or screws. The Applicant envisages further that the whole solar cell structure, with the exception of the external electrical connections, can be protected by a clear varnish which can also be printed onto the structure. For further protection from the external environment, the solar cell should be mounted in a glass cabinet.

The Applicant envisages further that TFT arrays using paper sheet substrates will have advantages over existing TFT arrays with regard to cost, flexibility and robustness for many applications. It is envisaged that in future developments, it will be possible to integrate a TFT array with any of the following display technologies on the same paper substrate to produce an integrated medium resolution display: crystal polymer, electroluminescent phosphors and e-Ink.

The invention claimed is:

1. A thin film semiconductor device including:
   a substrate comprising a material including cellulose; and
   a number of thin film layers of inorganic material deposited in layers on the substrate, wherein at least one thin film layer of inorganic material is printed onto one of the substrate or an underlying thin film layer of inorganic material, and
   wherein at least one of the thin film layers of inorganic material is an active semiconductor layer comprising a nanocrystalline silicon powder and a carrier comprising a polymer having insulating properties.

2. A thin film semiconductor device according to claim 1, wherein the substrate comprises paper sheet.

3. A thin film semiconductor device according to claim 1, wherein the carrier comprises cellulose acetate butyrate.

4. A thin film semiconductor device according to claim 3, wherein said active semiconductor layer is printed using an ink comprising said nanocrystalline silicon powder, said carrier comprising cellulose acetate butyrate, and a solvent.

5. A thin film semiconductor device according to claim 4, wherein the solvent comprises ether or lacquer thinners.

6. A thin film semiconductor device according to claim 1, including a transparent water-resistant seal.

7. A thin film semiconductor device according to claim 6, wherein the water resistant seal comprises a clear varnish or lacquer printed onto the device.

8. A semiconductor device according to claim 1, wherein the active semiconductor layer is printed using a transfer printing process selected from a group consisting of offset lithography printing, block printing, stamp printing, relief printing, gravure printing, letterpress printing and screen-printing using colloidal inks.

9. A semiconductor device according to claim 1, wherein each of the active semiconductor layers is printed onto one of an underlying thin film layer and substrate.

10. A semiconductor device according to claim 1, which is in the form of a photovoltaic cell.

11. A semiconductor device according to claim 10, wherein the photovoltaic cell comprises a first layer in the form of a metallic contact printed onto a major surface of the substrate, a second layer which is an active semiconductor layer comprising nanocrystalline silicon applied to the metallic contact, and a third layer defining a transparent contact printed onto the second layer which is an active semiconductor layer.

12. A semiconductor device according to claim 11, wherein the second layer which is an active semiconductor layer comprises an intrinsic semiconductor and the third layer comprises a p-type semiconductor.

13. A semiconductor device according to claim 11, wherein the second layer which is an active semiconductor layer comprises a semiconductor structure in n-i-p sequence.

14. A semiconductor device according to claim 11, including a fourth layer comprising a clear protective coating of dielectric material printed onto the third layer.

15. A semiconductor device according to claim 14, wherein the clear protective coating of dielectric material comprises a clear lacquer.

16. A semiconductor device according to claim 11, comprising a plurality of photovoltaic cells connected in series, each photovoltaic cell being formed adjacent to at least one other photovoltaic cell, with the third layer of at least one photovoltaic cell, defining the transparent contact thereof, overlapping the first layer of an adjacent photovoltaic cell, defining the metallic contact thereof, thereby connecting the adjacent photovoltaic cells electrically in series.

17. A power supply comprising at least one semiconductor device according to claim 16.

18. A semiconductor device according to claim 1, which is in the form of a field effect transistor.

19. A semiconductor device according to claim 18, wherein the field effect transistor includes a first layer defining metallic source and drain contacts printed onto the substrate, a second layer which is an active semiconductor layer comprising nanocrystalline silicon applied to the first layer, and a third layer defining a metallic gate electrode printed onto the second layer which is an active semiconductor layer.

20. A semiconductor device according to claim 19, wherein the metallic source and drain contacts of the first layer and the metallic gate electrode of the third layer extend at right angles to one another to define a "cross" geometry.

21. A semiconductor device according to claim 18, wherein the field effect transistor includes a first layer defining a gate contact printed onto the substrate, a second layer which is an active semiconductor layer comprising nanocrystalline silicon applied to the first layer, and a third layer defining metallic source and drain contacts printed onto the second layer which is an active semiconductor layer.

22. A semiconductor device according to claim 21, wherein the gate contact of the first layer and the metallic source and drain contacts of the third layer extend at right angles to one another to define a "cross" geometry.

23. A thin film semiconductor device according to claim 1, wherein the active semiconductor layer is applied by a three or four color lithographic printing process.

* * * * *